(12) United States Patent
Chen et al.

(10) Patent No.: US 11,735,921 B2
(45) Date of Patent: Aug. 22, 2023

(54) METHOD FOR FLATTENING IMPEDANCE OF POWER DELIVERY NETWORK BY MEANS OF SELECTING DECOUPLING CAPACITOR

(71) Applicants: Inventec (Pudong) Technology Corp., Shanghai (CN); Inventec Corporation, Taipei (TW)

(72) Inventors: Yen-Hao Chen, Taipei (TW); Ding-Bing Lin, Taipei (TW); Jhih-Yu Yu, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 118 days.

(21) Appl. No.: 17/351,279

(22) Filed: Jun. 18, 2021

(65) Prior Publication Data

US 2022/0320864 A1 Oct. 6, 2022

(30) Foreign Application Priority Data

Apr. 6, 2021 (CN) .......................... 202110369177.9

(51) Int. Cl.
*H02J 3/18* (2006.01)
*G05B 19/042* (2006.01)
*H02J 13/00* (2006.01)

(52) U.S. Cl.
CPC .............. *H02J 3/18* (2013.01); *G05B 19/042* (2013.01); *H02J 13/00002* (2020.01); *G05B 2219/2639* (2013.01)

(58) Field of Classification Search
CPC .... H02J 3/18; H02J 13/00002; G05B 19/042; G05B 2219/2639; H05K 1/025
See application file for complete search history.

(56) References Cited

U.S. PATENT DOCUMENTS 8,716,898 B1  5/2014  Liu
9,582,628 B1  2/2017  Oishei
(Continued)

FOREIGN PATENT DOCUMENTS

CN  102419790 A  4/2012
CN  111563356 A  8/2020
(Continued)

OTHER PUBLICATIONS

Liu, Y., Yuan, Y.-Z., Chen, K.-Q. and Chen, W.-W. (2015), Decoupling capacitors selection algorithm based on maximum anti-resonance points and quality factor of capacitor, [online], [retrieved Dec. 3, 2022] Electron. Lett., 51: 90-92. retrieved from https://doi.org/10.1049/el.2014.2236 (Year: 2015).*

(Continued)

*Primary Examiner* — Thomas C Lee
*Assistant Examiner* — Charles Cai
(74) *Attorney, Agent, or Firm* — Winston Hsu

(57) ABSTRACT

A method for flattening an impedance of a power delivery network includes capturing a set of impedance parameters, obtaining an impedance of the power delivery network according to the set of impedance parameters, defining a target impedance, performing an importance calculation to determine a port, obtaining an intersection frequency according to the target impedance and the impedance of the power delivery network, selecting a decoupling capacitor according to the intersection frequency, and disposing the decoupling capacitor at the port. The method can reduce the impedance of the power delivery network to the target impedance and flatten the impedance to avoid the rogue wave phenomenon.

10 Claims, 4 Drawing Sheets

(56) References Cited

U.S. PATENT DOCUMENTS

| | | | |
|---|---|---|---|
| 2012/0136598 A1 | 5/2012 | Dmitriev-Zdorov | |
| 2014/0009242 A1* | 1/2014 | Mantiply | H03H 7/38 333/33 |
| 2019/0206815 A1 | 7/2019 | Laguvaram | |
| 2022/0099720 A1* | 3/2022 | Halligan | G01R 27/04 |

FOREIGN PATENT DOCUMENTS

| | | | | |
|---|---|---|---|---|
| CN | 111563356 B | * | 7/2022 | G06F 30/367 |
| TW | I723648 B | | 4/2021 | |

OTHER PUBLICATIONS

Oldfriend, "Optimization Design of Power Integrity Defining Target Impedance", https://www.oldfriend.url.tw/Slwave/ansys_ch_Target%20Impedance.html, 2019.

Heidi Barnes, "Optimizing Power Distribution Networks for Flat Impedance", Signal Integrity Journal, https://www.signalintegrityjournal.com/articles/1715-optimizingpower-distribution-networks-for-flat-impedance, May 12, 2020.

* cited by examiner

METHOD FOR FLATTENING IMPEDANCE OF POWER DELIVERY NETWORK BY MEANS OF SELECTING DECOUPLING CAPACITOR

BACKGROUND OF THE INVENTION

1. Field of the Invention

The application is related to a method for flattening an impedance of a power delivery network, and more particularly, a method for flattening an impedance of a power delivery network by means of selecting a decoupling capacitor.

2. Description of the Prior Art

The power delivery network (PDN) can be an intermediary network for the voltage source to provide the direct-current (DC) power to the load. On the printed circuit board (PCB), the power delivery network is usually the transmission path from the voltage regulator module (VRM) to the load circuit. The power delivery network can be formed on the power layer and the ground layer of the printed circuit board, and the wires, connectors, capacitors and other components electrically connected to the power layer and the ground layer can all be part of the power delivery network.

Since the parasitic effect of the power delivery network can cause parallel resonance, it results in high self-impedance at the position of the load circuit. At the position of the load circuit, the problem of voltage disturbance will occur due to the change of the load current and the high self-impedance of the power delivery network.

In addition, when the curve of the self-impedance versus frequency of the power delivery network is not flat enough, the rogue wave problem caused by the overlapping of voltage disturbances will exacerbate the voltage disturbance problem. Since a server is an electronic device including a printed circuit board, and the power layer and ground layer of the printed circuit board can be part of the power delivery network, the design of the power delivery network of the printed circuit board of the server has to be considered to reduce the impedance to avoid noise interference and flatten the impedance to avoid the rogue wave phenomenon.

SUMMARY OF THE INVENTION

An embodiment provides a method for flattening an impedance of a power delivery network. The method includes capturing a set of impedance parameters of the power delivery network; obtaining an impedance of the power delivery network according to the set of impedance parameters; defining a target impedance; performing a first importance calculation to determine a first port; obtaining an intersection frequency according to the target impedance and the impedance of the power delivery network; selecting a first decoupling capacitor according to the intersection frequency; and disposing the first decoupling capacitor at the first port.

These and other objectives of the present invention will no doubt become obvious to those of ordinary skill in the art after reading the following detailed description of the preferred embodiment that is illustrated in the various figures and drawings.

DETAILED DESCRIPTION

In order to deal with the aforementioned problems, decoupling capacitors can be disposed to reduce the self-impedance of the power delivery network. However, although the impedance of the power delivery network can be reduced to the target impedance in this way, the impedance of the power delivery network has not been flattened and optimized regarding the impedance versus frequency (impedance-frequency) curve. The method provided by embodiments can be used to flatten and optimize the impedance of the power delivery network, as described below. In the text, the flatness of the impedance means the flatness regarding the impedance-frequency curve.

Figure 1:
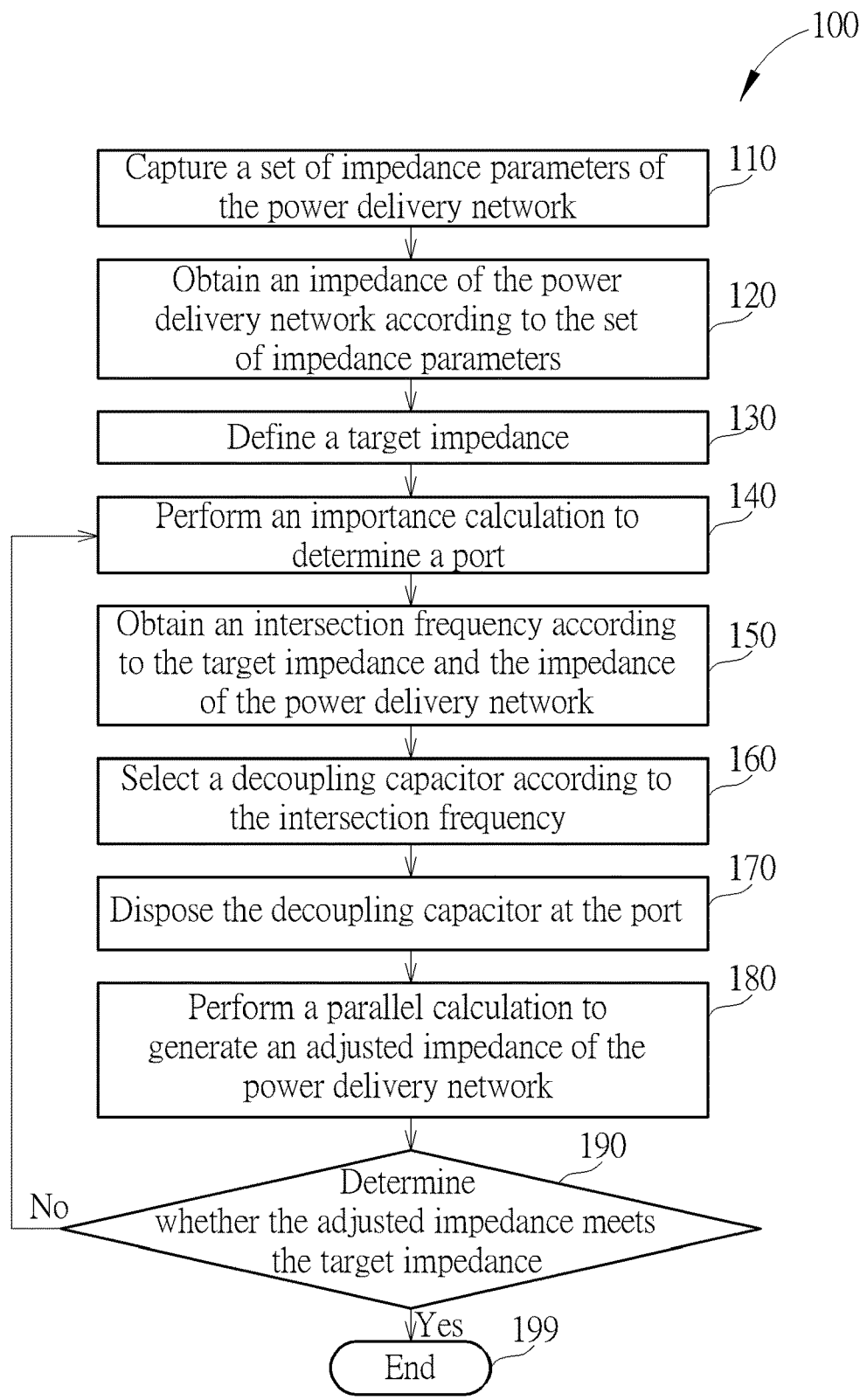
FIG. 1 is a flowchart of a method for flattening an impedance of a power delivery network.
Figure 2:
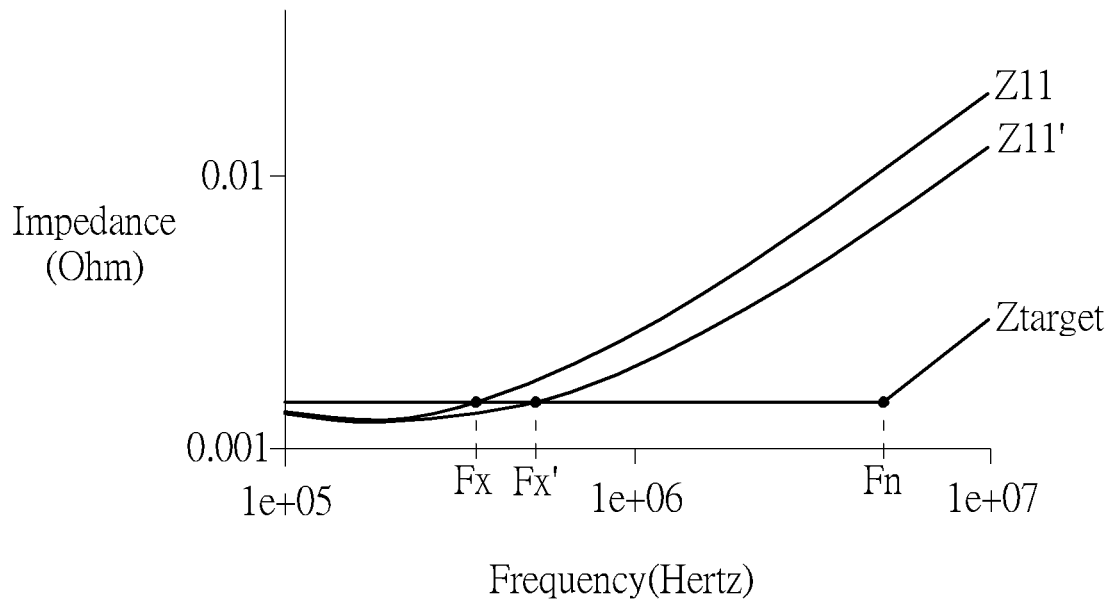
FIG. 2 illustrates the impedance versus frequency curves.

FIG. 1 is a flowchart of a method 100 for flattening an impedance of a power delivery network. FIG. 2 illustrates the impedance-frequency curves. As shown in FIG. 1 and FIG. 2, the method 100 can include the following steps.

Step 110: capture a set of impedance parameters of the power delivery network;
Step 120: obtain an impedance Z11 of the power delivery network according to the set of impedance parameters;
Step 130: define a target impedance Ztarget;
Step 140: perform an importance calculation to determine a port;
Step 150: obtain an intersection frequency Fx according to the target impedance Ztarget and the impedance Z11 of the power delivery network;
Step 160: select a decoupling capacitor according to the intersection frequency Fx;
Step 170: dispose the decoupling capacitor at the port;
Step 180: perform a parallel calculation to generate an adjusted impedance Z11' of the power delivery network;
Step 190: determine whether the adjusted impedance Z11' meets the target impedance Ztarget; if so, enter Step 199; else enter Step 140; and
Step 199: end.

Below, an example is used for describing the steps of FIG. 1. In Step 110, the scattering parameters (a.k.a. S-parameters) of the power delivery network can be captured. The impedance parameters can be calculated according to the S-parameters. The impedance parameters can be elements of the impedance matrix (a.k.a. Z-matrix) of the power delivery network.

In Step 120, the impedance Z11 of the power delivery network can be obtained according to the set of impedance parameters, and the curve of the impedance Z11 can be as shown in FIG. 2. The curve of the impedance Z11 can show the self-impedance of the power delivery network at different frequencies at this stage. FIG. 2 is only an example, and embodiments are not limited thereto. In FIG. 2, 1e+05 can mean $1 \times 10^5$, 1e+06 can mean $1 \times 10^6$, and so on.

The power delivery network can include a plurality of ports, the impedance Z11 can be an input impedance of the port coupled to a load device (e.g., an integrated circuit), and other ports can be used to dispose decoupling capacitor(s) for flattening the impedance Z11, as described below.

In Step 130, the target impedance Ztarget can be defined according to actual needs and product specifications. As shown in FIG. 2, the curve of the target impedance Ztarget can show the target impedance at different frequencies. For example, in the frequency band lower than the predetermined frequency Fh, the target impedance Ztarget can be a substantially constant impedance. Step 130 can be independent from Step 110 and 120; for example, Step 130 can be performed before Step 110 and Step 120.

As described in Step 140 to Step 170, the port of the highest importance can be selected from the multiple ports of the power delivery network, and the most suitable capacitor can be selected from multiple candidate capacitors to be the decoupling capacitor for being disposed at the selected port.

In Step 140, a plurality of drops of inductance after disposing capacitors at respective ports of the power delivery network can be calculated. A port with a largest drop of inductance can be selected, and the selected port can be regarded as the most important port. In other words, after disposing a capacitor at the most important port, the drop of inductance is largest.

For example, the power delivery network can be a 2-port network having a first port and a second port; for example, the first port can be coupled to the load device such as an integrated circuit, and the second port can be coupled to a decoupling capacitor. If the power delivery network is a 2-port network, the calculations of the equations eq-1 and eq-2 can be performed:

$$L_{11wdecap@2} = L11 - \frac{L12^2}{L22 + Ld}; \qquad \text{eq-1}$$

$$\Delta L_{11wGND@2} = -\frac{L12^2}{L22}. \qquad \text{eq-2}$$

L11 and L12 can be the self-inductances of the first port and the second port. L12 can be the mutual inductance of the first port and the second port. $L11_{wdecap@2}$ can be the adjusted element of the inductance matrix after disposing the decoupling capacitor at the second port. $\Delta L_{11wGND@2}$ can be the drop of the inductance after disposing the decoupling capacitor at the second port. Ld can be the self-inductance of the disposed decoupling capacitor. Ld can be a constant and can be ignored for the convenience of calculation. The equations eq-1 and eq-2 are only examples. If the power delivery network is an n-port network, the general equations related to the mutual inductances can be expressed as below:

$$L_{1nwdecap@A} = L1n - \frac{L1A \times LAn}{LAA + Ld(n)}; \qquad \text{eq-3}$$

$$L_{nnwdecap@A} = Lnn - \frac{LAn^2}{LAA + Ld(n)}. \qquad \text{eq-4}$$

For example, if the power delivery network is a 10-port network, Table 1 can be obtained according to the principles of the equation eq-2.

TABLE 1

| The number of the observed ports | Without disposing the decoupling capacitor | The number of the port at which the decoupling capacitor is disposed | | | | | | | | |
|---|---|---|---|---|---|---|---|---|---|---|
| | | P3 | P2 | P4 | P5 | P6 | P7 | P8 | P9 | P10 |
| L11 (unit: pH) | 1165.1 | 574 | 557 | 561 | 614 | 595 | 581 | 617 | 655 | 650 |
| $\Delta L_{11wGND@n}$ | | −677 | −696 | −693 | −628 | −650 | −668 | −622 | −575 | −583 |
| The relative importance of the port at which the decoupling capacitor is disposed | | 3 | 1 | 2 | 6 | 5 | 4 | 7 | 9 | 8 |

In the example of Table 1, when the decoupling capacitor is disposed at the port P2, the drop of impedance is largest. Hence the port P2 is the most important port and can be selected in Step 140. The number of ports and the related values in Table 1 are only examples, and embodiments are not limited thereto.

In Step 150, as shown in FIG. 2, the intersection frequency Fx can be obtained according to the curves of target impedance Ztarget and the impedance Z11 of the power delivery network on the impedance-frequency curve graph.

In Step 160, a decoupling capacitor can be selected from the decoupling capacitor library. In Step 170, the selected decoupling capacitor can be disposed at the port determined in Step 140.

After Step 170 is performed, because the decoupling capacitor is disposed, each element of the equivalent impedance matrix of the power delivery network can be changed, and the self-impedance of the power delivery network should be recalculated.

For example, if the power delivery network has 100 ports and another port coupled to a load device (e.g., an integrated circuit), the original impedance matrix can have a dimension of 101×101. After performing Step 170 to dispose a decoupling capacitor, the dimension of the impedance matrix can be 100×100, and each element of the matrix can be changed. Hence, the impedance matrix should be regenerated, and the self-impedance should be recalculated accordingly.

In Step 180, the parallel calculation can be performed according to the decoupling capacitor disposed in Step 170 to generate the adjusted impedance Z11' of the power delivery network. The said parallel calculation can be expressed as the equation eq-5:

$$Z11' = Z11 - (Z1i \times Zi1)/Z11 + Zd \qquad \text{eq-5.}$$

Z11 can be the original self-impedance of the power delivery network before the adjustment. Z11' can be the adjusted self-impedance of the power delivery network after disposing the decoupling capacitor. Z1i and Zi1 can be elements of the impedance matrix. If the dimension of the matrix is n×n, i and n are positive integers and 0<i≤n. Zd can be the impedance of the disposed decoupling capacitor.

In Step 190, it can be observed whether the adjusted impedance Z11' meets the target impedance Ztarget. If so, the flow can enter Step 199 to be ended; else, Step 140 can be performed to select a port again, and a suitable decoupling capacitor can be selected and disposed at the selected port according to the adjusted intersection frequency Fx' so that the curve of the impedance of the power delivery network can be flatter and closer to the curve of the target impedance Ztarget on the impedance-frequency graph.

In Step 190, it can be determined whether the adjusted impedance Z11' meets the target impedance Ztarget according to whether the adjusted impedance Z11' is lower than the target impedance Ztarget in a specific frequency band. Further, the standard deviation and the average value of the adjusted impedance Z11' in a specific frequency band can be used to determine whether the flatness is good enough. For example, in a specific frequency band, the standard deviation can be divided by the average value, and the quotient can be expressed as a percentage to describe the flatness.

Regarding Step 140 to Step 190, for example, a first importance calculation can be performed to determine a first port in Step 140, and Step 150 to Step 180 can be performed to dispose a first decoupling capacitor at the first port to obtain the adjusted impedance as shown in FIG. 1. If the adjusted impedance Z11' fails to meet the target impedance Ztarget in Step 190, a second importance calculation can be performed to determine a second port in Step 140, and Step 150 to Step 180 can be again performed to dispose a second decoupling capacitor at the second port to obtain the further adjusted impedance. Likewise, the flatness of the impedance Z11' can be further improved if needed. Here the first and second importance calculations are merely mentioned as an example to describe the steps in FIG. 1 can be performed in a looped manner, and embodiments are not limited thereto. If necessary, the steps in FIG. 1 can be performed in the looped manner to perform more times (for example, more than twice) of importance calculations to further improve the flatness of the adjusted impedance Z11'. In this example, as described above, the first importance calculation can include calculating a plurality of drops of inductance after disposing capacitors at respective ports of the power delivery network, and selecting a port with a largest drop of inductance to be the first port. Likewise, the second importance calculation can also include calculating a plurality of drops of inductance after disposing capacitors at respective ports of the power delivery network, and selecting a port with a largest drop of inductance to be the second port. If the third importance calculation, the fourth importance calculation and so on are performed, the calculation(s) can be similar to the abovementioned calculation.

Figure 3:
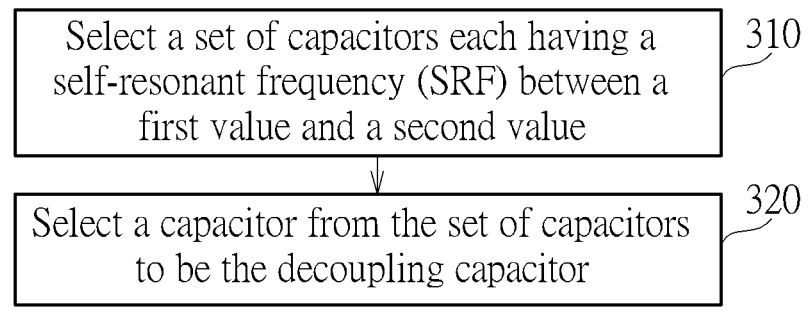
FIG. 3 to FIG. 5 are flowcharts of selecting the decoupling capacitor described in FIG. 1 according to different embodiments.

FIG. 3 is a flowchart of selecting the decoupling capacitor in Step 160. According to embodiments, Step 160 of FIG. 1 can include the following steps.

Step 310: select a set of capacitors each having a self-resonant frequency (SRF) between a first value and a second value; and Step 320: select a capacitor from the set of capacitors to be the decoupling capacitor.

The first value can be A times the intersection frequency Fx, the second value can be B times the intersection frequency Fx, A and B are positive parameters, and 0<A<B.

For example, if there are 200 selectable capacitors in the library, and 30 capacitors of them have the self-resonant frequencies between A×Fx and B×Fx, a capacitor of the 30 capacitors can be selected to be the decoupling capacitor.

According to embodiments, 0.5<A<B<5. According to embodiments, A can be substantially equal to 1.5, and B can be substantially equal to 3.

Figure 4:
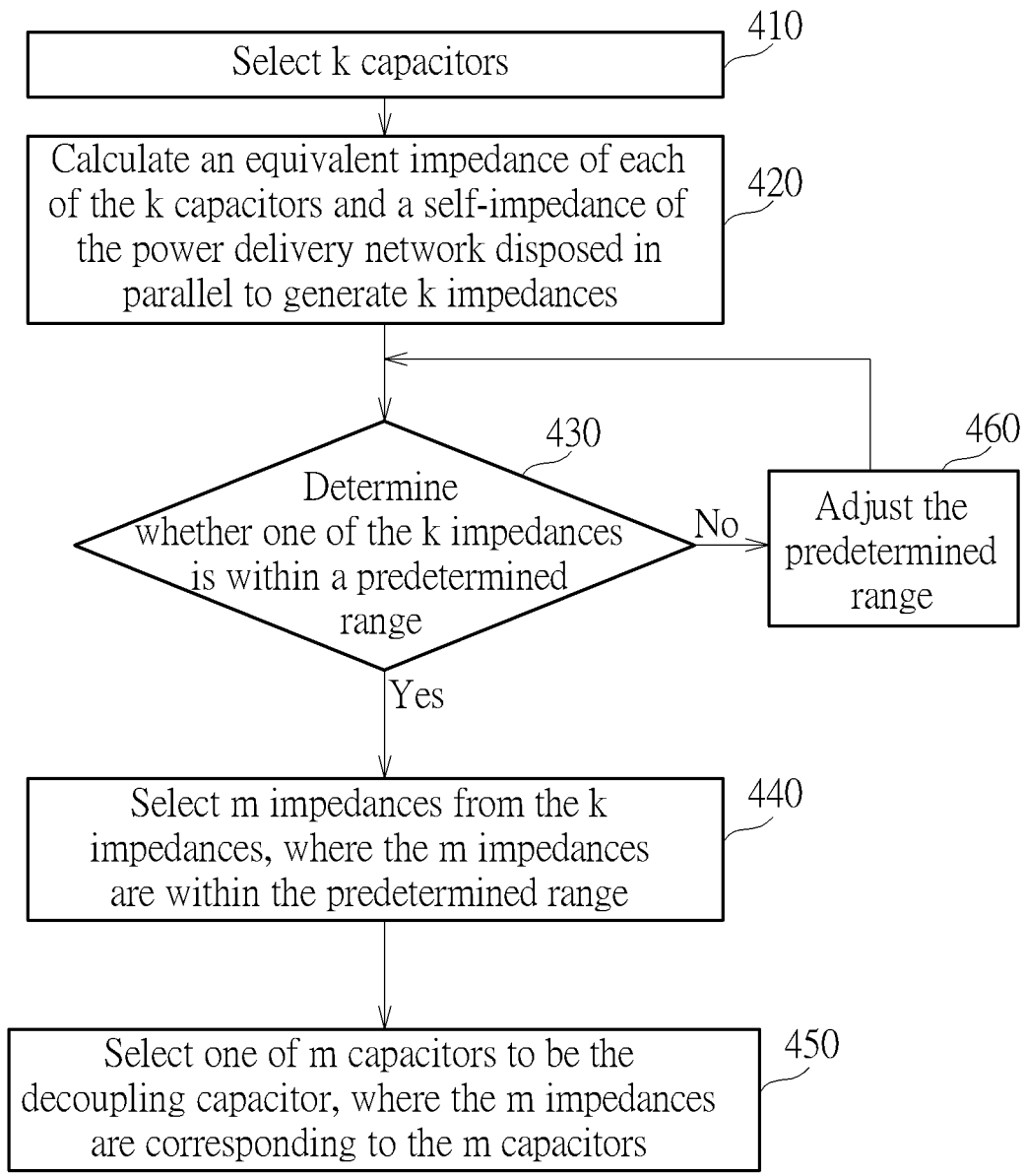

FIG. 4 is a flowchart of selecting the decoupling capacitor in Step 160 according to another embodiment. Step 160 of FIG. 1 can include the following steps.

Step 410: select k capacitors;

Step 420: calculate an equivalent impedance of each of the k capacitors and a self-impedance of the power delivery network disposed in parallel to generate k impedances;

Step 430: determine whether one of the k impedances is within a predetermined range; if so, enter Step 440; else, enter Step 460;

Step 440: select m impedances from the k impedances, where the m impedances are within the predetermined range;

Step 450: select one of m capacitors to be the decoupling capacitor, where the m impedances are corresponding to the m capacitors; and Step 460: adjust the predetermined range, and enter Step 430.

In FIG. 4, m and k are positive integers, and 0<m≤k. In Step 430, the predetermined range is between α times of the target impedance and β times of the target impedance, and 0<α<β.

For example, if the 100 candidate capacitors are respectively disposed at the ports determined in Step 140 of FIG. 1, 100 equivalent impedances (i.e. 100 adjusted self-impedances Z11' of the power delivery network) can be obtained. In the 100 adjusted self-impedances Z11', if 40 adjusted self-impedances are within the range of α×Ztarget to β×Ztarget, one of the 40 candidate capacitors corresponding to the 40 adjusted self-impedances can be selected to be the decoupling capacitor, and other 60 candidate capacitors can not be selected.

For example, α can be 0.9, and β can be 1. If none of the k impedances is within a predetermined range in Step 430, α can be reduced to increase the predetermined range to obtain the impedance(s) within the predetermined range in Step 430 and Step 440. For example, α can be gradually adjusted from 0.9 to 0.85, 0.8, 0.75 . . . etc. to gradually increase the predetermined range. According to another embodiment, α and β can both be adjusted so that the predetermined range is different after being adjusted.

Figure 5:
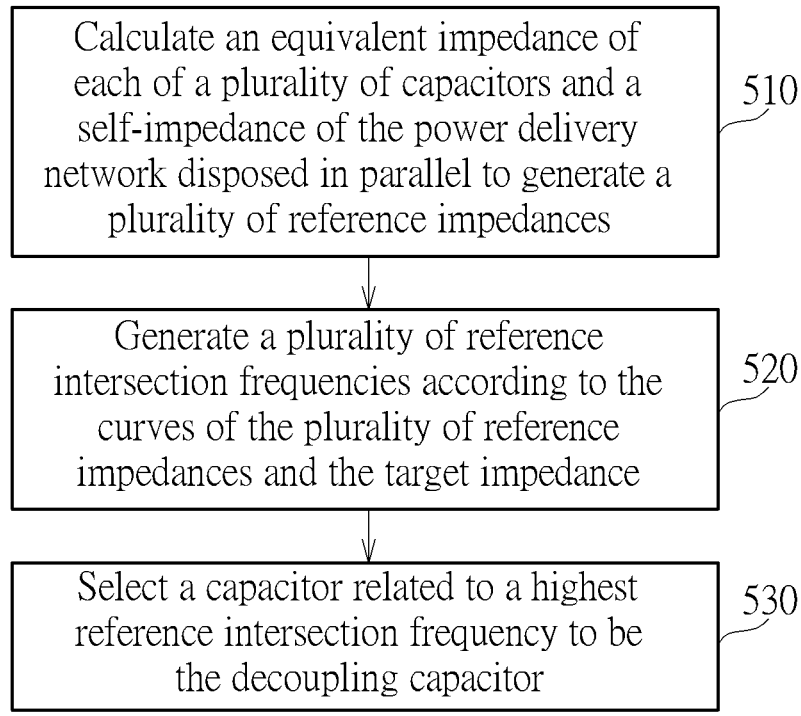

FIG. 5 is a flowchart of selecting the decoupling capacitor in Step 160 according to another embodiment. Step 160 of FIG. 1 can include the following steps.

Step 510: calculate an equivalent impedance of each of a plurality of capacitors and a self-impedance of the power delivery network disposed in parallel to generate a plurality of reference impedances;

Step 520: generate a plurality of reference intersection frequencies according to the curves of the plurality of reference impedances and the target impedance; and Step 530: select a capacitor related to a highest reference intersection frequency to be the decoupling capacitor.

Figure 6:
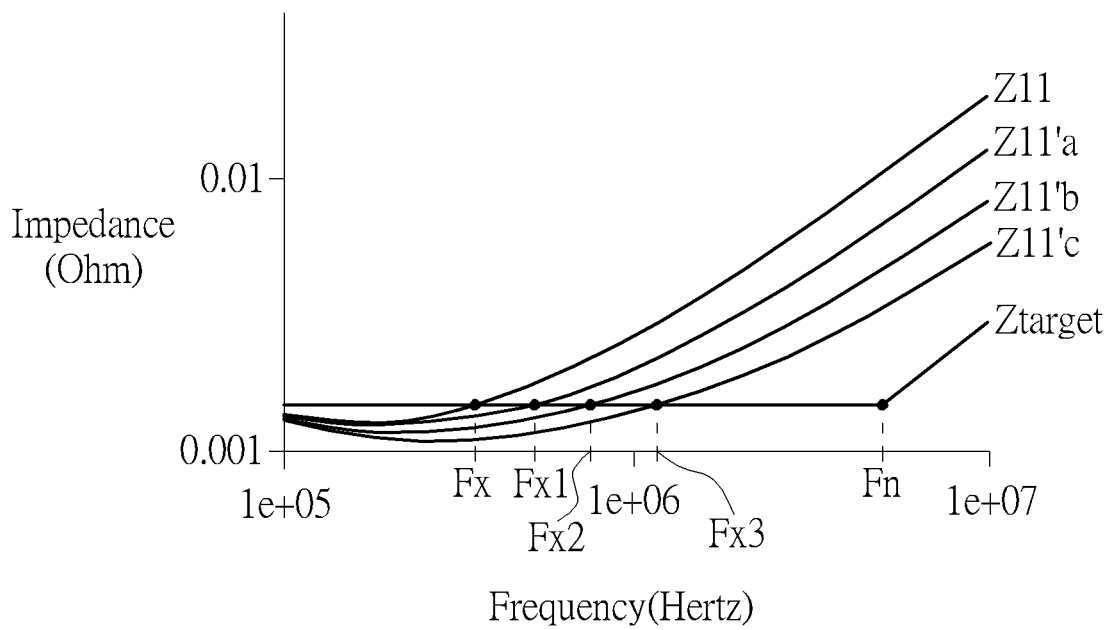
FIG. 6 illustrates the curves related to the flow of FIG. 5.

FIG. 6 illustrates the curves related to the flow of FIG. 5. FIG. 6 is only an example, and embodiments are not limited thereto. For example, after three candidate capacitors are respectively disposed at the ports determined in Step 140, three reference impedances Z11'a, Z11'b and Z11'c and their curves on the impedance-frequency graph can be obtained. As shown in FIG. 6, according to the curves of the reference impedances Z11'a, Z11'b and Z11'c and the target impedance Ztarget, reference intersection frequencies Fx1, Fx2 and Fx3 can be obtained, and the reference intersection frequency Fx3 is the highest of the frequencies Fx1, Fx2 and Fx3.

Hence, in the three candidate capacitors, the capacitor corresponding to the reference intersection frequency Fx3 and the reference impedance Z11'c can be selected to be the decoupling capacitor.

The flows of FIG. 3, FIG. 4 and FIG. 5 can be sequentially used to select the decoupling capacitor. For example, if there are 100 candidate capacitors, the flow of FIG. 3 can be used to select 30 capacitors, then the flow of FIG. 4 can be used to select 10 capacitors from the 30 capacitors, and then the flow of FIG. 5 can be used to select 1 capacitor from the 10 capacitors to be the decoupling capacitor selected in Step 160 of FIG. 1. However, this is only an example, and the sequence of performing the flows of FIG. 3, FIG. 4 and FIG. 5 is not limited to the example.

In summary, by means of the methods provided by embodiments, the most important port can be effectively selected, and a suitable decoupling capacitor can be selected to be disposed at the selected port. By performing the flow of FIG. 1 in a looped manner, the suitable decoupling capacitor can be disposed at the suitable port to flatten the impedance of the power delivery network. According to experiments, the curve of the adjusted impedance Z11' obtained by using the methods of the embodiments can be closer to the curve of the target impedance Ztarget on the impedance-frequency curve graph and have improved flatness. Hence, the methods of embodiments effectively avoid the rogue wave phenomenon, and are helpful to deal with the difficulties in the field.

The methods of the present disclosure can be applied to the design of the printed circuit board of the server for the server to have a high-quality power delivery network to improve the stability of the server. Hence, the server can be applied to artificial intelligence (AI) computing and edge computing. The server can also be used as a 5G (5th generation mobile communication technology) server, cloud server or car networking server.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for flattening an impedance of a power delivery network, the method comprising:
   capturing a set of impedance parameters of the power delivery network;
   obtaining an impedance of the power delivery network according to the set of impedance parameters;
   defining a target impedance;
   performing a first importance calculation to determine a first port;
   obtaining an intersection frequency according to the target impedance and the impedance of the power delivery network;
   selecting a first decoupling capacitor according to the intersection frequency; and
   disposing the first decoupling capacitor at the first port.

2. The method of claim 1, further comprising:
   performing a parallel calculation to generate an adjusted impedance of the power delivery network;
   performing a second importance calculation to determine a second port;
   obtaining an adjusted intersection frequency according to the target impedance and the adjusted impedance of the power delivery network;
   selecting a second decoupling capacitor according to the adjusted intersection frequency; and
   disposing the second decoupling capacitor at the second port.

3. The method of claim 1, wherein selecting the first decoupling capacitor comprises:
   selecting a set of capacitors each having a self-resonant frequency between a first value and a second value; and
   selecting a capacitor from the set of capacitors to be the first decoupling capacitor;
   wherein the first value is A times the intersection frequency, the second value is B times the intersection frequency, A and B are positive parameters, and $0<A<B$.

4. The method of claim 3, wherein A is substantially equal to 1.5.

5. The method of claim 3, wherein B is substantially equal to 3.

6. The method of claim 1, wherein selecting the first decoupling capacitor comprising:
   selecting k capacitors;
   calculating an equivalent impedance of each of the k capacitors and a self-impedance of the power delivery network disposed in parallel to generate k impedances;
   selecting m impedances from the k impedances, the m impedances being within a predetermined range; and
   selecting one of m capacitors to be the first decoupling capacitor, the m impedances being corresponding to the m capacitors;
   wherein m and k are positive integers, and $0<m \leq k$.

7. The method of claim 6, wherein the predetermined range is between $\alpha$ times of the target impedance and $\beta$ times of the target impedance, and $0<\alpha<\beta$.

8. The method of claim 1, wherein selecting the first decoupling capacitor comprises:
   selecting k capacitors;
   calculating an equivalent impedance of each of the k capacitors and a self-impedance of the power delivery network disposed in parallel to generate k impedances;
   selecting impedances within a first predetermined range from the k impedances; and
   selecting m impedances from the k impedances if none of the k impedances is within the first predetermined range, the m impedances being within a second predetermined range; and
   selecting one of m capacitors to be the first decoupling capacitor, the m impedances being corresponding to the m capacitors;
   wherein m and k are positive integers, and $0<m \leq k$.

9. The method of claim 1, wherein selecting the first decoupling capacitor comprises:
   calculating an equivalent impedance of each of capacitors and a self-impedance of the power delivery network disposed in parallel to generate a plurality of reference impedances;
   generating a plurality of reference intersection frequencies according to the plurality of reference impedances and the target impedance; and
   selecting a capacitor related to a highest reference intersection frequency to be the first decoupling capacitor.

10. The method of claim 1, wherein performing the first importance calculation to determine the first port comprises:
    calculating a plurality of drops of inductance after disposing capacitors at respective ports of the power delivery network; and selecting a port with a largest drop of inductance to be the first port.

\* \* \* \* \*